United States Patent [19]

Asakura et al.

[11] Patent Number: 4,470,944
[45] Date of Patent: Sep. 11, 1984

[54] PROCESS FOR PRODUCING AN AROMATIC POLYIMIDE FILM

[75] Inventors: Toshiyuki Asakura; Masanori Mizouchi; Hiroaki Kobayashi, all of Ohtsu, Japan

[73] Assignee: Toray Industries, Inc., Tokyo, Japan

[21] Appl. No.: 463,549

[22] Filed: Feb. 3, 1983

[30] Foreign Application Priority Data

Feb. 23, 1982 [JP] Japan .................. 57-27729

[51] Int. Cl.³ ............................. B29D 7/08
[52] U.S. Cl. ..................... 264/216; 264/178 R; 264/203; 264/331.12; 264/331.19; 264/344; 428/473.5; 524/104; 524/233; 524/600
[58] Field of Search .............. 264/203, 205, 183, 184, 264/344, 178 R, 216, 331.12, 331.19; 428/473.5; 524/600, 233, 104

[56] References Cited

U.S. PATENT DOCUMENTS 3,179,614 4/1965 Edwards ..................... 260/30.2
4,073,837 2/1978 Kouzai ........................ 264/184

FOREIGN PATENT DOCUMENTS 48-100460 of 1973 Japan .
898651 9/1959 United Kingdom .
903271 3/1960 United Kingdom .
903272 3/1960 United Kingdom .
1155541 3/1967 United Kingdom .

Primary Examiner—James B. Lowe
Assistant Examiner—Michael McGurk
Attorney, Agent, or Firm—Austin R. Miller

[57] ABSTRACT

The present invention relates to a process for producing an of aromatic polyimide film comprising (A) casting on a support a dope containing an amide-type polar solvent and 10–45 weight percent of a polyamic acid having more than 0.4 dl/g an inherent viscosity of more than 0.4 dl/g, (B) concentrating the polymer content to be at least higher than that of the initial dope while simultaneously raising the ring closure ratio above 30%, (C) removing the solvent from the film by extraction in an aqueous medium so as to lower the solvent content of the film below 10% and (D) then heating the film to a temperature of more than 200° C.

The process of the present invention is useful for the production of aromatic polyimide film having a reduced rate of solvent decomposition and improved productivity.

The aromatic polyimide film produced by the process of the present invention is superior in thermal as well as mechanical properties and is highly useful as an electric insulation material and also as a base for flexible printed circuits, magnetic tape, etc.

18 Claims, No Drawings

PROCESS FOR PRODUCING AN AROMATIC POLYIMIDE FILM

BACKGROUND OF THE INVENTION (1) Field of the Invention

The present invention relates to a process for producing of aromatic polyimide film. More particularly, it relates to an aromatic polyimide film-making process having superior productivity.

(2) Description of the Prior Art

Aromatic polyimide film has been known for its excellent heat resistance and electrical as well as mechanical properties, and has been widely used as a base film for electric and electronic applications, elements for spaceships and many kinds of industrial uses.

Such films of aromatic polyimide are generally made by a dry process from an organic solvent solution of polyamic acid as a precursor thereof.

As to production processes for aromatic polyimide film, there are known as prior arts British Pat. Nos. 898,651, 903,271, 903,272, 1,155,541 and U.S. Pat. No. 3,179,614, wherein disclosed are methods consisting basically in casting a solution of polyamic acid over a support, treating it for ring closure by heating or by the use of a chemical reagent, then peeling the wet or gel film formed off the support and letting the remaining volatile content of the film vaporize by heating.

These known processes, however, invariably have very low solvent removal rates resulting in a low productivity, and further drawbacks such as thermal decomposition of solvent or the like when heated at a high temperature and increased costs because of the large amount of thermal energy needed etc., leading to inefficient productivity. Meanwhile, a wet process is disclosed in Japanese Patent Application Laid Open Publication No. 100460/1973 and in its Example 1 is described a process wherein a polyamic acid is fed to an extruder of 20 mm diameter preheated to 85° C., and extruded as a film through its die under a back pressure of 55 kg/cm².

The molten extruded film is fed into a water bath placed 25 cm under the die to be wound on a metal drum placed in the lower part of the bath. The water wetting the films surface is wiped off, and the film is fed to heat treating equipment. The temperature of the water bath maintained at 20° C., and the residence time in water is 3.5 minutes. The film coming out of the water bath is self-supportable and its R.S. (residual solvent content) is 42%. The heat treating equipment is of the tenter type, being capable of treating for 1 minute at 200° C. and 3 minuters at 350° C. The polyimide film obtained has a ring closure ratio of 100%.

In the described process, however, the extruded film is immediately introduced into water, hence it is difficult to obtain a film of good surface smoothness.

SUMMARY OF THE INVENTION

It is an object of the present invention to provide a process for producing of aromatic polyimide film of high productivity. Another object of the invention is to provide a process for producing an aromatic polyimide film of a high solvent recovery ratio. Still another object of the invention is to provide a process for producing of highly stretchable aromatic polyimide film.

The present invention, therefore, relates to a process for producing of aromatic polyimide film comprising (A) casting a dope containing an amide-type polar solvent and 10-45 weight percent of a polyamic acid having more than 0.4 dl/g in inherent viscosity on a support, (B) concentrating the polymer content to be at least higher than that of the initial dope (as by heating or chemically) while simultaneously raising the ring closure ratio above 30% (as by heating or chemically), (C) removing the solvent from the film by extraction in an aqueous medium so as to lower the solvent content of the film below 10% and (D) then heating the film to a temperature above 200° C.

DESCRIPTION OF THE PREFERRED EMBODIMENTS

The film produced by the process of the present invention is an aromatic polyimide having the recurring structural unit represented by the formula (I) below. The polyamic acid used as a starting material for producing the polyimide film has the recurring structural unit represented by the formula (II) below.

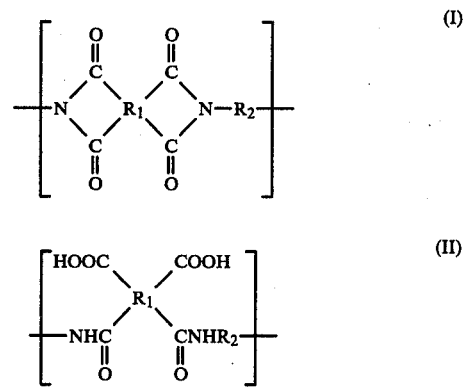

where

contains at least one aromatic ring and two carbonyl groups bonded on adjacent carbon atoms and the number of carbon atoms in quadrivalent $R_1$ is preferably 6-25.

In the formulas —$R_2$ is preferably a divalent organic group with a carbon number of 6-25 and containing at least one aromatic ring derived from an aromatic diamine of the general formula $H_2N-R_2-NH_2$.

The

group is derived from an aromatic tetracarboxylic acid component of the general formula:

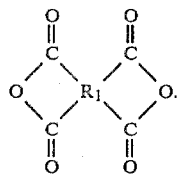

As typical and preferred examples of such aromatic tetracarboxylic acid component are cited the following:

Pyromellitic dianhydride, 3,3',4,4'-diphenyl tetracarboxylic acid dianhydride, 2,3,6,7-naphthalene tetracarboxylic acid dianhydride, 2,2-bis(3,4-dicarboxyphenyl) ether tetracarboxylic acid dianhydride, pyridine-2,3,5,6-tetracarboxylic acid dianhydride, 3,3',4,4'-benzophenone tetracarboxylic acid dianhydride or tetracarboxylic acid esters thereof.

Pyromellitic dianhydride, 3,3',4,4'-diphenyl tetracarboxylic acid dianhydride and 3,3',4,4'-benzophenone tetracarboxylic acid dianhydride are particularly preferred.

Meanwhile, the preferred aromatic diamine components are those in which the two amino groups are not in adjacent positions, and which contain at least one aromatic ring as $R_2$ and whose carbon number is 6–25, having divalent organic groups, e.g. p-xylylene diamine, m-phenylene diamine, benzidine, 4,4'-diaminodiphenyl ether, 4,4'-diaminodiphenyl methane, 4,4'-diaminodiphenyl sulfone, 3,3'-dimethyl-4,4'-diaminodiphenyl methane, 1,5-diaminonaphthalene, 3,3'-dimethoxy benzidine and 1,4-bis(3-methyl-5-aminophenyl) benzene, of which particularly preferable being 4,4'-diaminodiphenyl ether and m- and p-phenylene diamine.

Needless to say, these acid components and amine components can be used either alone or mixed together.

As the solvent for polymerization of dope of film-making is used a proper amide-type solvent miscible with water, but it is required that it have a high dissolving power and be inert to the polymer. Preferred examples include N,N'-dimethyl acetamide, N,N'-diethyl acetamide, N-methyl-2-pyrrolidone, N-methyl caprolactam, N,N'-dimethyl formamide, tetramethylene sulfone, hexamethyl phosphoramide etc. either alone or in combination, of which particularly preferred are N,N'-dimethyl acetamide and N-methyl-2-pyrrolidone.

The polymer concentration in the dope used in the process of the present invention is required to be 10–45 weight percent, preferably 15–30 weight percent, and said amide-type solvent concentration is preferably of 90–55%, but the dope may contain other polymers and/or additives as well.

If the polymer concentration is lower than 10 weight percent, the viscosity of the dope tends to be too low to perform uniform casting thereof, possibly causing uneven film thickness. If, on the other hand, the polymer concentration is higher than 45 weight percent, the viscosity of the dope tends to be too high, possibly causing deterioration of the film's surface smoothness as well as uneven film thickness.

The dope of the present invention may contain suitable additives such as fillers, antioxidizing agents, coloring materials, other polymers and so on. The proper solution viscosity of the dope at the casting temperature is 100–20,000 poise, preferably 900–5,000 poise.

As methods of preparing the polyimide precursor (polyamic acid) as the dope for film-making are known such alternatives as preparing a polar solvent solution of diamine and adding thereto tetracarboxylic acid dianhydride in powder form at a low temperature (normally 50° C. to −10° C., and preferably 30° C. to −5° C.), or preparing in advance an amine oligomer having a terminal amine group through the reaction of excess molar diamine with tetracarboxylic acid and then reacting it with tetracarboxylic acid anhydride in an amount required to make up for sufficient molecular weight. A preferred method of preparing the polyimide precurser is by the so-called low-temperature solution polymerization method, wherein the imide ring closure ratio of the polymer is near zero, preferably less than 5%.

If the ring closure ratio of such a dope is too high, it is likely to cause precipitation or separation of the polymer from the dope as well as gelation, and it is difficult to achieve uniform casting or to obtain a uniform film as the final product.

To prevent deterioration of the mechanical properties of the final film and embrittlement of the film in the course of film-making, it is necessary to keep the molecular weight of the polymer in the dope above a specific level, and it is convenient to use inherent viscosity as the measure therefor. Since, if the inherent viscosity ($\eta_{inh}$) is too low the aforesaid defects are likely to result, the viscosity of the polyimide precursor (polyamic acid) should preferably be 0.4, 5.0 dl/g and more preferably 1.0–3.0 dl/g. Also, if the dope viscosity at the time of casting is too low, it is likely to cause non-uniformity in casting, and if it is too high, it is likely to cause troubles such as melt fracture. Hence it is essential to adjust the dope viscosity to a proper level.

The dope of the polyimide precursor (polyamic acid) so prepared is cast (or coated) in a film-like layer over a support such as a glass or metal plate and then heated typically to a temperature between 40° C. and 250° C., preferably between 50° C. and 200° C., for drying and imidization to proceed. In order to make a self-supportable film and to impart improved mechanical properties to the final film, the polymer concentration of the film after the casting and drying process must be higher than the concentration of the initial dope preferably 50–80 weight percent, and the imide ring closure ratio of the polymer must be more than 30%, preferably 35–90%.

That is, if the polymer concentration is less than the concentration of the initial dope it is then difficult to obtain a self-supportable film even if the ring closure ratio is raised, and the handling of the film becomes difficult for the subsequent process. Also, if the imide ring closure ratio is less than 30%, the polymer is subject to hydrolysis in the subsequent wet process and heating, causing the final film to become embrittled and having poor mechanical properties. To ensure against these problems, it is usually preferable to control the heating temperature for the cast film in the range of 40°–250° C., preferably 50°–200° C. If this heating temperature is below 40° C., the time required to raise the imidization ratio above 30% becomes too long and the process becomes commercially undesirable. When this temperature is above 250° C., bubble formation takes place due to rapid evaporation of the solvent. Moreover rapid rise of the imidization rate and rapid hydrolysis are likely to result and it then becomes extremely difficult to control the physical properties of the final film. Needless to say, the imide ring closure reaction may be performed by heating as aforesaid, or by one of the known alternatives of ring closure reaction such as chemical ring closure by the use of dehydration reagents such as acetic anhydride and/or catalysts such as a tertiary amine, for example, pyridine. In the case of chemical ring closure, the ring closure reaction is likely to proceed easier even at low temperatures than in the case of thermal ring closure. When ring closure is effected chemically, it may be satisfactorily completed in this stage. In either case, however, it is necessary that the polymer concentration of the film immediately before it is introduced into an aqueous medium should be at least higher than that of the initial dope.

The self-supportable film, with its polymer concentration adjusted by the dry process to more than that of the initial dope and the polymer imide ring closure ratio above 30%, preferably 35–90%, is then immersed in or sprayed with an aqueous medium for extraction of the solvent. By aqueous medium is here meant a liquid mainly composed of water, which is a poor solvent for polymers but has a good affinity for the organic polar amide-type solvent constituting the dope. Liquids usable as the aqueous medium are for instance, water, water mixed with amid-type solvents constituting the dopes and water mixed with ethylene glycol, acetone and/or an alcohol with a low carbon number. When the solvent removal rate and solvent recovery ratio are taken into consideration, the ratio of water in aqueous medium is desired to be at least 50%. Also, of those liquids cited above, particularly preferred is water or its mixture with an amide-type solvent. The working temperature in the wet process ranges from the freezing point to the boiling point of the aqueous solvent used in the process, usually 5°–90° C. In said wet process, the amide-type organic solvent constituting the dope is to be extracted, and the solvent content of the film just after completion of the wet processing is preferably less than 10% of the weight of polymer, more preferably less than 5%. An increased residue of the solvent is not desirable for it means an increased decomposition loss of the solvent in the step of the subsequent heat treatment. The solvent content is maintained below 10% by adjusting the time of immersion in the bath during wet processing, the bath temperature and the film thickness etc. In order to obtain a uniformly coagulated film by the wet process, it is advisable to arrange for gradual progress of the coagulation of the polymer by the use of a multibath for inhibiting sudden precipitation of the polymer in a gel state film. Still more preferred is stretching the film in this stage for improvement of its final mechanical properties. The film is easily stretched in its aqueous solvent swollen state and at a relatively low temperature range of 5°–90° C.

After completion of the wet processing, the film is heat-treated for removal by vaporization of the aqueous medium as well as of the residual amounts of amide-type solvent and also for completion of imidization of the polymer by raising the ring closure ratio to more than 90% if necessary. The temperature during this heating stage should be at least 200° C., preferably between 230° C. and 700° C. If the temperature is lower than 200° C., such inconveniences result in insufficient ring closure and too long a time required for removal of the volatiles of the film. Considering the final hygroscopic property and mechanical properties of the film, the imide ring closure ratio should be raised to more than 90% in the process if it is found to be less. Hence the heating temperature in this stage is required to be more than 200° C. Although it is preferred to heat the film under tension in this stage, stretching or relaxing the film may be performed as necessary.

In the process of the present invention, the open polyamic acid in the dope is closed to achieve a specific ring closure ratio. Thereafter the solvent removal is done in an aqueous medium under a high polymer concentration and a film is obtained by heating at a temperature above a specific level. Therefore, the process of the present invention has the following advantages. In the conventional, so-called dry process without water extraction, the residual solvent in the film is almost completely decomposed or vaporized in the subsequent stage of heat treatment and is difficult to recover. In the wet process of the present invention, the residual solvent is free from decomposition and the greater part thereof is recoverable, resulting in increased productivity. Further, the film swollen in the course of wet processing is easy to stretch and a film of outstanding mechanical properties is easily obtained. Furthermore, the solvent removal rate in the wet process is generally higher than the solvent removal rate by heating, this meaning advantages a higher film-making rate and greater ease with which thick films are obtained.

The imide ring closure ratio referred to in the present invention is calculated by the following formula with said ratio as 0 when the polymer consists solely of polyamic acid and 100 when the polymer is perfectly converted into polyimide. Perfect conversion into polyimide is here defined to be the case when a film of polyamic acid is heated for 30 minutes at 300° C.

$$\text{Ring closure ratio (\%)} = \frac{\text{(No. of imide rings closed)}}{\text{(No. of none-closed amic acid in polymer)} + \text{(No. of imide rings closed)}} \times 100$$

This value is obtainable by mechanical analysis methods such as IR absorption spectrum and NMR spectrum or by the acid value measuring method. In the given examples of the present invention the imide ring closure ratio was calculated from 720 cm$^{-1}$ (imide ring absorption) and 875 cm$^{-1}$ (p-substituted phenyl absorption) of the IR absorption spectrum.

The inherent viscosity ($\eta_{inh}$) referred to in the present invention is calculated by the following formula with 0.5 g/100 ml N-methyl-2-pyrrolidone as solvent at 30° C. by the use of an Ubelode-type viscometer.

$$\eta_{inh} \text{ (dl/g)} = \frac{\log\left(\frac{\text{Flow time of solution}}{\text{Flow time of solvent}}\right)}{\text{Concentration}}$$

Described below are typical preferred examples of the present invention.

EXAMPLE 1

26 wt. parts of 4,4'-diaminodiphenyl ether were dissolved in 231 wt. parts of dehydrated N,N'-dimethyl acetamide. Then 28.4 wt. parts of pyromellitic acid dianhydride in powder form were added gradually at 15° C. under stirring. The viscosity of the dope increased progressively with increasing addition of the same and when stirring was continued for 1 hour after completion of its addition, polyamic acid having an imide ring closure ratio of almost zero was obtained, and the resulting dope showed an inherent viscosity ($\eta_{inh}$) of 1.5 and a solution viscosity of 1,300 poises. The polymer concentration of this dope was 19%. Then this dope was uniformly cast over a glass plate by the use of a doctor knife adjusted to a gap of 150μ, and it was kept for 15 minutes in a hot air oven heated to 140° C. A pale yellow, self-supportable film with an imide ring closure ratio of 52% was obtained. Then the film was peeled-off and it was immersed for 5 minutes in running water of 20° C., the residual amount of dimethyl acetamide in the film was 1% of the weight of the polymer as measured by gas chromatographic analysis. When this film was set on a frame and heated for 2 minutes at 200° C., or for 7 minutes at 300° C., a polyimide film (thickness: 28μ) having an imide ring closure ratio close to 100% was obtained. The physical properties of this film are shown below in Table 1 together with the control example described below.

CONTROL EXAMPLE 1

Now a control example was described hereunder to show that a film having a lower imide ring closure ratio is inferior when it is made by a dry wet process.

The polyamic acid dope polymerized in Example 1 was cast over a glass plate also by the use of an applicator and it was kept for 20 minutes in an oven at 75° C. for drying and imidization. The polymer concentration of the film peeled off the glass plate was 52%, but the imide ring closure ratio was only 14%. When the film so obtained was similarly treated in running water for 10 minutes for solvent removal to reduce the residual solvent ratio to 1% and was heated with its length kept constant for 2 minutes at 200° C. and 7 minutes at 300° C., the resultant polyimide film was embrittled and easy to tear. Its physical properties are shown also in Table 1.

TABLE 1

| Physical property | Example 1 | Control Example 1 |
|---|---|---|
| Imidization ratio (%) immediately after dry process | 52 | 14 |
| Polymer concentration (%) immediately after dry process | 70 | 52 |
| Residual solvent ratio (%) immediately after wet process | 1 | 1 |
| Strength (kg/mm$^2$) of film | 23 | 3 |
| Elongation (%) | 80 | 2 |
| Young's modulus (kg/cm$^2$) | 316 | 300 |
| Folding endurance (MIT) (times) | 30,000 | 50 |

EXAMPLE 2

20 wt. parts of 4,4'-diaminodiphenyl ether were dissolved in 133.4 wt. parts of N-methyl-2-pyrrolidone and to the solution 25 wt. parts of 3,3',4,4'-diphenyl tetracarboxylic acid dianhydride were added in powder form under cooling to 10° C. and under stirring and the mixture was then stirred further for 30 minutes.

Then, to the mixture a solution of 2.2 wt. parts of 3,3',4,4'-diphenyl tetracarboxylic acid dianhydride in 8.2 parts of N-methyl-2-pyrrolidone was added dropwise until the reaction was completed. The resulting dope was 25% in polymer concentration, $\eta_{inh}=0.95$ and 2,000 poises in solution viscosity. This dope was debubbled and then extruded through a slit of 200μ by a gear pump onto an SUS plate, then it was dried for 10 minutes in a hot air oven of 120° C. and a pale yellow self-supportable film with an imide ring closure ratio of 40% and a polymer concentration of 65% was obtained. This film was immersed for 3 minutes in a 10° C. bath of 80% water and 20% N-methyl-2-pyrrolidone, stretched 1.5 times in one direction and treated for 1 minute in running water for solvent removal and a film having a residual solvent ratio of 1.5% was thus obtained. This film was heated with its length kept constant for 3 minutes at 150° C. and 330° C. respectively and a 25μ thick polyimide film having an imide ring closure ratio above 97% was thus obtained. The films obtained were pale yellow, transparent and tough ones with strengths of 35 kg/mm$^2$ in the stretched direction and 12 kg/mm$^2$ in the transverse direction.

For comparison, the same dope was cast on to an SUS plate and kept immersed in the same bath and then treated in running water without a concentration step or a ring closure step. However, the precipitation of the polymer occurred early in the course of wet processing and the resulting film was very brittle and was white turbid with no practical value.

EXAMPLE 3

14.28 wt. parts of 3,3',4,4'-benzophenone tetracarboxylic acid dianhydride were dissolved in a 1/1 (by weight) mixed solvent of N-methyl-2-pyrrolidone and N,N'-dimethyl acetamide and to the solution 13.86 parts of 4,4'-diaminodiphenyl methane were added in powder form under stirring at 10° C., this followed by further stirring for 3 hours. The resulting polyamic acid dope had a ring closure ratio of about 0, $\eta_{inh}=1.1$, a 33% polymer concentration and a solution viscosity of 4,500 poises.

This dope was cast on to an SUS plate in the same manner as described in Example 2, heated for 10 minutes at 130° C. for the polymer concentration to be increased to 57% with the imide ring closure ratio adjusted to 45% and was then immersed for 5 minutes in a water bath of 20° C. for solvent removal, and thus a film with 2% residual solvent was obtained. When this film was heated for 2 minutes at 220° C. with its length kept constant, its volatiles content was less than 1%. A 35μ thick film having an imidization ratio of about 100% was obtained after being heated for 3 minutes at 300° C. The strength and elongation of this film were 15 kg/mm$^2$ and 18% respectively and the time required for film-making by this method was 20 minutes. To compare it with the film-making time in the pure dry process, the above film just before immersion into a water bath was heated for 15 minutes at 220° C. with its length kept constant, and the film was still found to contain 33% solvent based on the weight of the polymer, indicating very slow solvent evaporation.

It was only after further heating for 7 minutes at 300° C. that a 35μ film was produced having a volatiles content of less than 1% and an imide ring closure ratio of about 100%. The time required for film-making by this dry process was 32 minutes, 1.5 times longer than by the process of the present invention and it was revealed that the quantity of irrecoverable solvent amounted up to 33% of the polymer weight.

What is claimed is:

1. A process for producing an aromatic polyimide film comprising the steps of: (A) casting on a support a dope containing an amide-type polar solvent and 10–45 weight percent of a polyamic acid having an inherent viscosity of more than 0.4 dl/g, (B) concentrating the polymer content to be at least higher than that of the initial dope while simultaneously raising the ring closure ratio above 30%, (C) removing the solvent from the film by extraction in an aqueous medium so as to lower the solvent content of the film below 10% and (D) then heating the film to a temperature above 200° C.

2. A process for producing an aromatic polyimide film as claimed in claim 1, wherein the inherent viscosity of said polyamic acid is less than 5.0 dl/g.

3. A process for producing an aromatic polyimide film as claimed in claim 1, wherein said polyamic acid has a recurring structural unit of the following general formula:

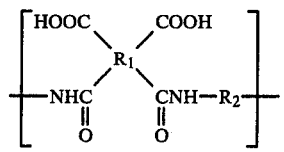

where $R_1$ is a quadrivalent organic group with 6–25 carbon atoms and contains at least one aromatic ring; and $R_2$ is a divalent organic group with 6–25 carbon atoms and contains at least one aromatic ring.

4. A process for production of aromatic polyimide film as claimed in claim 1, wherein said polyamic acid has a recurring structural unit of the following general formula.

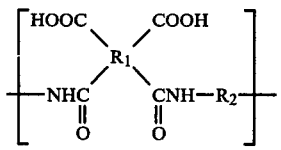

where $R_1$ is a quadrivalent organic group with 6–25 in carbon number and containing at least one aromatic ring, and $R_2$ is a divalent organic group with 6–25 in carbon number and containing at least one aromatic ring.

5. A process for producing an aromatic polyimide film as claimed in claim 1, wherein said polyamic acid is derived from pyromellitic acid dianhydride and 4,4'-diaminodiphenyl ether.

6. A process for producing an aromatic polyimide film as claimed in claim 1, wherein the concentration of said polymer in step (B) is more than 50 weight percent.

7. A process for producing an aromatic polyimide film as claimed in claim 1, wherein said support comprises at least one member selected from the group consisting of a glass support and a metal support.

8. A process for producing an aromatic polyimide film as claimed in claim 1, wherein said amide-type polar solvent comprises at least one member selected from the group consisting of N,N'-dimethyl acetamide and N-methyl-2-pyrrolidone.

9. A process for producing an aromatic polyimide film as claimed in claim 1, wherein said dope has a solution viscosity of 100–20,000 poises at the casting temperature.

10. A process for producing an aromatic polyimide film as claimed in claim 1, wherein said polymer's ring closure ratio in step (B) is 35–90%.

11. A process for producing an aromatic polyimide film as claimed in claim 1, wherein the concentration of said dope and the ring closure ratio in step (B) are effected by heating the dope to a temperature in the range of 40°–250° C.

12. A process for producing an aromatic polyimide film as claimed in claim 1, wherein said aqueous medium is one selected from the group consisting of water and a mixture of water and said amide-type solvent said mixture containing more than 50 weight percent of water.

13. A process for producing an aromatic polyimide film as claimed in claim 1, wherein step (C) is carried out with the temperature of said aqueous medium in the range of 5°–90° C.

14. A process for producing an aromatic polyimide film as claimed in claim 1, wherein the heating temperature in step (D) is in the range of 230°–700° C.

15. A process for producing an aromatic polyimide film as claimed in claim 1, wherein said aromatic polyimide has a recurring structural unit represented by the following general formula:

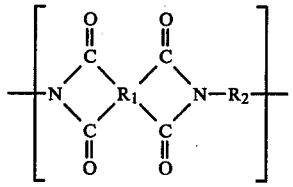

where $R_1$ is a quadrivalent organic group with 6–25 carbon atoms and contains at least one aromatic ring; and $R_2$ is a divalent organic group with 6–25 carbon atoms and contains at least one aromatic ring.

16. A process for producing an aromatic polyimide film as claimed in claim 1, wherein the ring closure in step (B) is done chemically.

17. A process for producing an aromatic polyimide film as claimed in claim 16, wherein acetic anhydride and a tertiary amine are used for said chemical ring closure.

18. A process for producing an aromatic polyimide film as claimed in claim 17, wherein the tertiary amine is pyridine.

* * * * *